(12) United States Patent
Iwata et al.

(10) Patent No.: US 8,995,129 B2
(45) Date of Patent: Mar. 31, 2015

(54) HEAT RADIATOR AND MANUFACTURING METHOD THEREOF

(75) Inventors: Yoshitaka Iwata, Kariya (JP); Shogo Mori, Kariya (JP); Tomoya Hirano, Oyama (JP); Kazuhiko Minami, Oyama (JP)

(73) Assignees: Kabushiki Kaisha Toyota Jidoshokki, Aichi-Ken (JP); Showa Denko K. K., Tokyo (JP)

( * ) Notice: Subject to any disclaimer, the term of this patent is extended or adjusted under 35 U.S.C. 154(b) by 326 days.

(21) Appl. No.: 13/443,152

(22) Filed: Apr. 10, 2012

(65) Prior Publication Data

US 2012/0262883 A1 Oct. 18, 2012

(30) Foreign Application Priority Data

Apr. 18, 2011 (JP) ................................. 2011-092200
Dec. 22, 2011 (JP) ................................. 2011-282072

(51) Int. Cl.
*H05K 7/20* (2006.01)
*H01L 23/473* (2006.01)
*H01L 23/34* (2006.01)
*H01L 23/00* (2006.01)

(52) U.S. Cl.
CPC .......... *H01L 23/473* (2013.01); *H05K 7/20254* (2013.01); *H01L 24/32* (2013.01); *H01L 2224/291* (2013.01); *H01L 2224/32225* (2013.01); *H01L 2924/01068* (2013.01); *H01L 2224/32245* (2013.01); *H01L 2924/00013* (2013.01); *H01L 2924/13055* (2013.01)
USPC ........... 361/702; 361/699; 361/711; 361/719; 257/714; 257/717; 165/80.4; 165/104.33

(58) Field of Classification Search
USPC ....................... 361/679.46–679.54, 688–723; 165/80.2–80.3, 185; 257/706, 713, 257/714, 722; 174/16.3
See application file for complete search history.

(56) References Cited

U.S. PATENT DOCUMENTS 7,569,929 B2 * 8/2009 Mori et al. ..................... 257/706
8,198,539 B2 * 6/2012 Otoshi et al. .................. 174/252

(Continued)

FOREIGN PATENT DOCUMENTS

CN          101312167    11/2008
EP          2284883       2/2011

(Continued)

OTHER PUBLICATIONS

Chinese Office Action, dated May 20, 2014, in counterpart Chinese Patent Application No. 201210107274.1, along with an English-language translation thereof.

*Primary Examiner* — Zachary M Pape
(74) *Attorney, Agent, or Firm* — Greenblum & Bernstein, P.L.C.

(57) ABSTRACT

A back metal layer (16, 31) has a plurality of stress relaxation spaces (17). Each stress relaxation space (17) is formed to open at least at one of the front surface and the back surface of the back metal layer (16, 31). A region in the back metal layer (16, 31) that is directly below a semiconductor device (12) is defined as a directly-below region (A1), and a region outside the directly-below region (A1) that corresponds to and has the same dimensions as the directly-below region (A1) is defined as a comparison region (A21). The volume of the stress relaxation spaces (17) in the range of the directly-below region (A1) is less than the volume of the stress relaxation spaces (17) formed in the range of the comparison region (A21).

9 Claims, 4 Drawing Sheets

(56) References Cited

U.S. PATENT DOCUMENTS

| | | | |
|---|---|---|---|
| 8,472,193 B2* | 6/2013 | Mori et al. | 361/710 |
| 2001/0050429 A1 | 12/2001 | Ashdown | |
| 2008/0290498 A1* | 11/2008 | Mori et al. | 257/712 |
| 2008/0290499 A1* | 11/2008 | Nishi et al. | 257/712 |
| 2008/0290500 A1* | 11/2008 | Iwata et al. | 257/712 |
| 2008/0291636 A1* | 11/2008 | Mori et al. | 361/709 |
| 2009/0139704 A1* | 6/2009 | Otoshi et al. | 165/185 |
| 2009/0141451 A1 | 6/2009 | Mori et al. | |
| 2009/0174063 A1* | 7/2009 | Furukawa et al. | 257/703 |
| 2010/0002399 A1* | 1/2010 | Mori et al. | 361/719 |
| 2010/0187680 A1* | 7/2010 | Otsuka et al. | 257/706 |
| 2012/0175765 A1* | 7/2012 | Mori et al. | 257/706 |
| 2012/0182695 A1 | 7/2012 | Mori et al. | |
| 2013/0256867 A1 | 10/2013 | Mori et al. | |

FOREIGN PATENT DOCUMENTS

| | | |
|---|---|---|
| JP | 2001-196514 | 7/2001 |
| JP | 2006-294699 | 10/2006 |
| JP | 2008-235672 | 10/2008 |
| JP | 2009-130061 | 6/2009 |
| JP | 2010-016254 | 1/2010 |
| JP | 2010-16295 | 1/2010 |
| JP | 2011-023545 | 2/2011 |
| WO | 2009/131217 | 10/2009 |

* cited by examiner

HEAT RADIATOR AND MANUFACTURING METHOD THEREOF

BACKGROUND

The present disclosure relates to a heat radiator having a circuit substrate and a heat sink. The present disclosure also relates to a method for manufacturing the heat radiator.

A conventionally known semiconductor apparatus has a ceramic substrate, which is an insulation substrate, and a front metal plate, which is joined to the front surface of the ceramic substrate and serves as a wiring layer, and a back metal plate joined to the back of the ceramic substrate. A semiconductor device is joined to the front metal plate. A heat sink, which radiates heat generated by the semiconductor device, is joined to the back metal plate. Heat generated by the semiconductor device during operation of the semiconductor apparatus is radiated through the heat sink. The heat radiating performance of the heat sink is desired to be maintained for an extended period of time. However, depending on the use conditions for the semiconductor apparatus, cracks may form at the joint portions between the ceramic substrate and the back metal plate due to thermal stress caused by the difference in the coefficient of linear expansion between the insulation substrate and the heat sink. Also, extension of cracks can cause the back metal plate to peel off the ceramic substrate, which can lower the heat radiating performance.

In this regard, Japanese Laid-Open Patent Publication No. 2006-294699, for example, discloses a semiconductor apparatus that has a stress relaxation member, which is located between a back metal plate and a heat sink. According to the document, an aluminum plate is used as a stress relaxation member, in which multiple through holes are formed to extend in the direction of the thickness. This structure relaxes thermal stress when the semiconductor apparatus operates.

In the semiconductor apparatus disclosed in the document, an air layer is formed between the back metal plate and the heat sink because of the through holes formed in the aluminum plate. Since air has a lower thermal conductivity than aluminum, the heat generated by the semiconductor device reaches the heat sink after bypassing parts of the aluminum plate in which the through holes are formed. That is, the through holes hinder diffusion of the heat generated by the semiconductor device. In other words, the structure hinders transmission of heat to the heat sink, and lowers the cooling efficiency.

Accordingly, it is an objective of the present disclosure to provide a heat radiator that promotes diffusion of heat generated by a semiconductor device while relaxing thermal stress generated during operation of a semiconductor apparatus. The present disclosure also provides a method for manufacturing the heat radiator.

SUMMARY

In accordance with one aspect of the present disclosure, a heat radiator that includes a circuit substrate and a heat sink is provided. The circuit substrate includes: an insulation substrate formed to have a front surface and a back surface; a front metal layer joined to the front surface of the insulation substrate, the front metal layer being formed to have a front surface to which a semiconductor device can be joined and a back surface joined to the insulation substrate; and a back metal layer joined to the back surface of the insulation substrate, the back metal layer being formed to have a front surface joined to the insulation substrate and a back surface joined to the heat sink. The back metal layer has a plurality of stress relaxation spaces. Each stress relaxation space is formed to open at least at one of the front surface and the back surface of the back metal layer. When a region in the back metal layer that is directly below the semiconductor device is defined as a directly-below region, and a region outside the directly-below region that corresponds to and has the same dimensions as the directly-below region is defined as a comparison region, the volume of the stress relaxation spaces in the range of the directly-below region is less than the volume of the stress relaxation spaces formed in the range of the comparison region.

According to the configuration, thermal stress is relaxed due to the stress relaxation spaces formed in the back metal layer. Also, the thermal conductivity of the range of the directly-below region in the back metal layer is improved compared to the thermal conductivity of the comparison region. Therefore, the heat generated by the semiconductor device is readily transferred to the region directly below the semiconductor device, and the thermal diffusion is unlikely to be hindered. The heat radiator can reliably transfer the heat generated by the semiconductor device to the heat sink. Thus, the heat radiator achieves a balance between absorption of thermal stress and improvement of the heat radiating performance in the region directly below the semiconductor device, which generates a great amount of heat.

In accordance with one aspect, the stress relaxation spaces in the range of the directly-below region are formed in a peripheral portion of the directly-below region and are not formed in a center portion of the directly-below region. The stress relaxation spaces in the range of the comparison region are formed in a peripheral portion and a center portion of the comparison region. Thus, the volume of the stress relaxation spaces in the range of the directly-below region is less than the volume of the stress relaxation spaces formed in the range of the comparison region.

According to the configuration, the stress relaxation spaces are formed in the peripheral portion in the range of the directly-below region in the back metal layer. The stress relaxation spaces are not formed in the center portion of the directly-below region, which is a region inside the peripheral portion of the directly-below region. Therefore, the center portion of the directly-below region in the back metal layer is a solid body in the back metal layer. That is, the center portion of the semiconductor device and the heat sink are joined to each other without the stress relaxation spaces in between in the lamination direction. In the semiconductor device, heat is most concentrated in its center portion. Thus, the heat generated by the semiconductor device is transferred to a part directly below its center portion by the greatest amount. According to the above configuration, since the stress relaxation spaces are not formed in a part directly below the semiconductor device, diffusion of the heat that is transferred to the part directly below the semiconductor device is unlikely to be hindered, which allows the heat to be efficiently transferred to the heat sink. That is, the heat radiator achieves a balance between absorption of thermal stress and improvement of the heat radiating performance in the region directly below the semiconductor device, which generates a great amount of heat.

In accordance with one aspect, the insulation substrate, the back metal layer, and the heat sink are joined together with brazing filler. At least a part of the stress relaxation spaces in the range of the directly-below region is filled with the brazing filler. Thus, the volume of the stress relaxation spaces in the range of the directly-below region is less than the volume of the stress relaxation spaces formed in the range of the comparison region.

According to the configuration, when the back metal layer is joined to the insulation substrate or to the heat sink, the brazing filler that flows in the stress relaxation spaces is regulated. This reduces the volume of the stress relaxation spaces in the range of the directly-below region compared to the volume of the stress relaxation spaces in the comparison region.

In accordance with one aspect, the back metal layer is a stress relaxation member.

According to this configuration, the joint layer, which joins the circuit substrate and the heat sink to each other, functions as a stress relaxation member. That is, the joint layer also serves as a stress relaxation member. Therefore, for example, a stress relaxation member and a joint layer do not need to be formed separately. This reduces the number of components.

In accordance with one aspect, the back metal layer includes: a first back metal layer joined to the heat sink; and a second back metal layer that is located between the first back metal layer and the insulation substrate and joined to the first back metal layer and the insulation substrate. The stress relaxation spaces are formed in the first back metal layer.

According to the configuration, the stress relaxation spaces are not formed in the second back metal layer. The heat generated by the semiconductor device is transferred to the first back metal layer via the second back metal layer. Since the stress relaxation spaces are not formed in the second back metal layer, the heat transferred to the second back metal layer is not hindered from being diffused, and is effectively transferred to the first back metal layer. The heat radiator therefore can effectively transfer heat to the heat sink.

In accordance with another aspect of the present disclosure, a method for manufacturing a heat radiator having a circuit substrate and a heat sink is provided. The circuit substrate includes: an insulation substrate having a front surface and a back surface; a front metal layer joined to the front surface of the insulation substrate, the front metal layer having a front surface to which a semiconductor device can be joined and a back surface joined to the insulation substrate; and a back metal layer joined to the back surface of the insulation substrate, the back metal layer having a front surface joined to the insulation substrate and a back surface joined to the heat sink. The back metal layer has a plurality of stress relaxation spaces. When a region in the back metal layer that is directly below the semiconductor device is defined as a directly-below region, and a region outside the directly-below region that corresponds to and has the same dimensions as the directly-below region is defined as a comparison region. The manufacturing method includes: preparing brazing filler, wherein, outside the range of the directly-below region, the brazing filler has a space that corresponds to the stress relaxation spaces, and, in the range of the directly-below region, the brazing filler has another space having a volume smaller than the volume of the space formed in the comparison region; arranging the brazing filler at a joint interface of the back metal layer; heating the brazing filler to a temperature above a melting temperature to melt the brazing filler; and cooling the melted brazing filler to a temperature below the melting temperature to set the brazing filler.

According to the method, the through holes formed in the range in the directly-below region of the back metal layer are filled with the brazing filler. The thermal conductivity of the range of the directly-below region in the back metal layer is improved compared to the thermal conductivity of the comparison region. Therefore, the heat generated by the semiconductor device is readily transferred to the region directly below the semiconductor device, and the thermal diffusion is unlikely to be hindered. The heat radiator can reliably transfer the heat generated by the semiconductor device to the heat sink. Thus, a balance is achieved between absorption of thermal stress and improvement of the heat radiating performance in the region directly below the semiconductor device, which generates a great amount of heat.

In accordance with one aspect, preparing the brazing filler includes forming the brazing filler such that the brazing filler covers a part of or entire opening of at least one of the stress relaxation spaces in the range of the directly-below region, and that the brazing filler does not cover the openings of the stress relaxation spaces outside the range of the directly-below region.

According to the method, melted brazing filler readily enters the stress relaxation space, which has an opening covered by brazing filler that has not been melted. Also, melted brazing filler is unlikely to enter the stress relaxation space, which has the opening that is not covered by brazing filler and which has not been melted. Therefore, the through holes in the range of the directly-below region are readily filled with a great amount of brazing filler.

Other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

A first embodiment of the present disclosure will now be described with reference to FIGS. 1 and 2.

Figure 1:
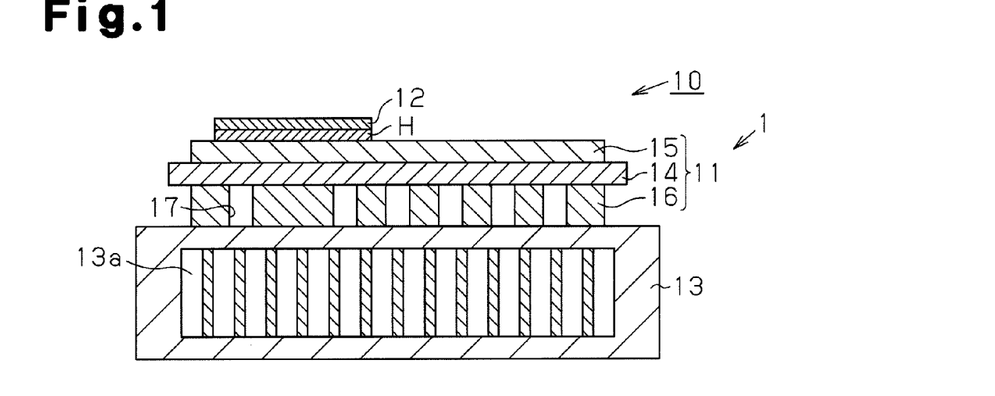
FIG. 1 is a vertical cross-sectional view taken along line A-A of FIG. 2, illustrating a semiconductor module, which is a semiconductor apparatus according to a first embodiment.

As shown in FIG. 1, a semiconductor apparatus, which is a semiconductor module 10 in the present embodiment, is formed by a circuit substrate 11, which is joined onto the circuit substrate 11 with solder, and a heat sink 13. The heat sink 13 is joined to the circuit substrate 11 on a side opposite to the semiconductor device 12. In the present embodiment, the upper surface of each component as viewed in FIG. 1 is defined as a front surface, and the lower surface is defined as a back surface. The circuit substrate 11 includes a ceramic substrate 14, a front metal plate 15, which is joined to the front surface of the ceramic substrate 14 with brazing filler, a back metal plate 16, which is joined to the back surface of the ceramic substrate 14 with brazing filler. That is, the back surface of the front metal plate 15 is joined to the front surface of the ceramic substrate 14. The front surface of the back metal plate 16 is joined to the back surface of the ceramic substrate 14. The front metal plate 15 is a metal circuit board that allows the semiconductor device 12 to be joined to the front surface of the ceramic substrate 14.

That is, the front surface of the ceramic substrate 14 is a mounting surface, on which the semiconductor device 12 is mounted. The front metal plate 15, which functions as a wiring layer, is joined to the mounting surface of the semiconductor device 12. The semiconductor device 12 is joined to the front metal plate 15 via a solder layer H. As the semiconductor device 12, an IGBT (Insulated Gate Bipolar Transistor) or a diode is used, for example.

On the other hand, the back metal plate 16 functions as a joint layer, which joins the ceramic substrate 14 and the heat sink 13 to each other.

The ceramic substrate 14 is an insulation substrate that is formed, for example, of aluminum nitride, alumina, or silicon nitride. The front metal plate 15 and the back metal plate 16 are formed of pure aluminum or copper. Linearly extending refrigerant passages 13a are defined in the heat sink 13. In the present embodiment, the circuit substrate 11 and the heat sink 13 form a heat radiator 1. The semiconductor device 12 is joined to the heat radiator 1 with solder, so that the heat radiator 1 and the semiconductor device 12 form the semiconductor module 10.

The back metal plate 16 will now be described. As shown in FIG. 2, through holes 17 are formed in the back metal plate 16. Each through hole 17 functions as a stress relaxation space. Each through hole 17 extends in the direction of thickness of the back metal plate 16, that is, in the direction in which the ceramic substrate 14 and the back metal plate 16 are laminated. That is, the through holes 17 each have openings on the front surface and the back surface of the back metal plate 16. Since the through holes 17 substantially have the same size, the stress relaxation spaces have the same volume.

The through holes 17 will be described. The rectangular region surrounded by a line formed by a long dash alternating with two short dashes in FIG. 2 is a directly-below region A1, which a region on the back metal plate 16 that corresponds with the semiconductor device 12. A peripheral edge A11 of the directly-below region A1 is located directly below a peripheral edge 12a of the semiconductor device 12. Outside the directly-below region A1, the through holes 17 are arranged at constant intervals, that is, in a grid-like manner, from the outer peripheral edge A11 of the directly-below region A1 to the peripheral edge 16a of the back metal plate 16.

On the other hand, within the directly-below region A1, the through holes 17 are located in the vicinity of the peripheral edge A11 of the directly-below region A1. The through holes 17 are arranged such that the distance between each of the through holes 17 formed at positions close to the peripheral edge A11 in the directly-below region A1 and the adjacent one of the through holes 17 formed outside the directly-below region A1 is constant.

A region on the back metal plate 16 that is inside the through holes 17 formed in the directly-below region A1 is defined as an inside region A2. No through holes 17 are formed in the inside region A2. On the back metal plate 16, the inside region A2 is located within the range of the region A1 directly below the semiconductor device 12. Since no through holes 17 are formed in the inside region A2, the area of joint between the semiconductor device 12 and the heat sink 13 is relatively large.

Figure 2:
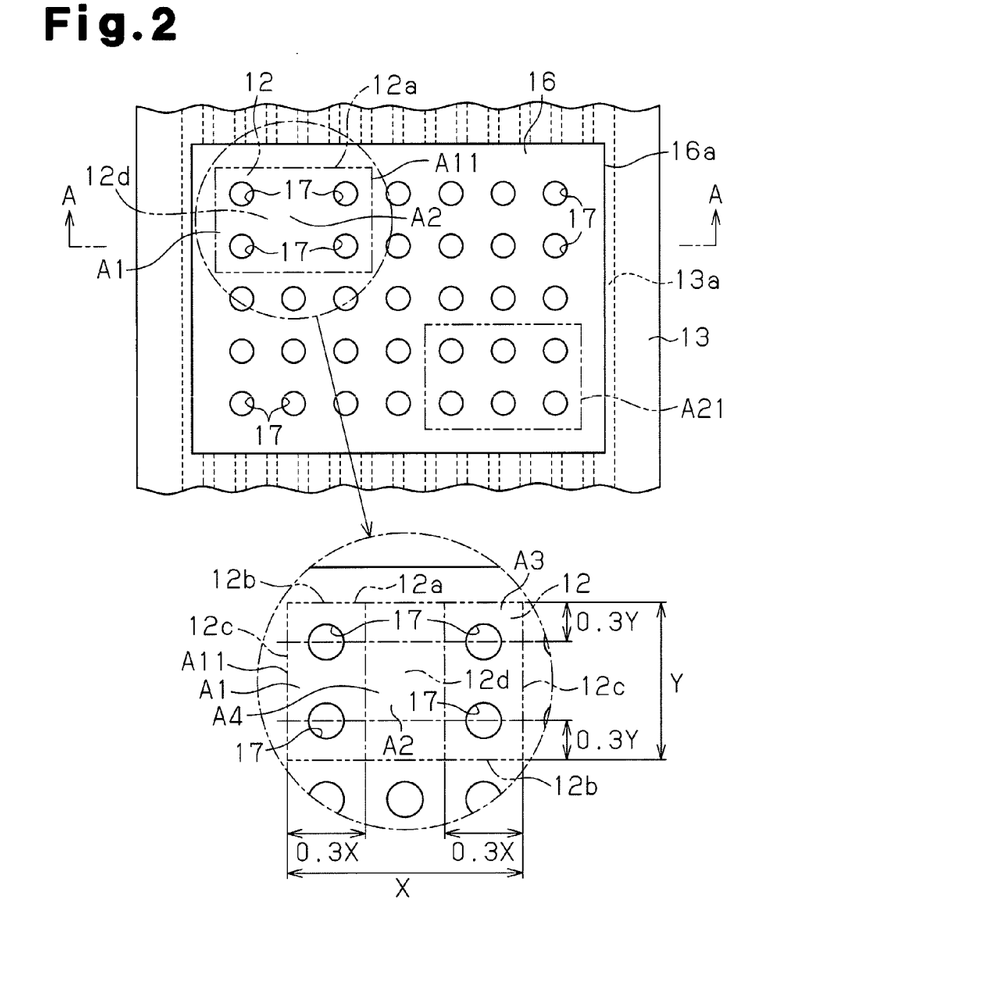
FIG. 2 is a plan view showing the relationship between the back metal plate and the semiconductor device shown in FIG. 1.

FIG. 2 shows a comparison region A21, which is compared with the directly-below region A1. The comparison region A21 is located on the back metal plate 16 and outside the directly-below region A1. The comparison region A21 has the same dimensions as the directly-below region A1 to correspond to the directly-below region A1. The number of the through holes 17 in the directly-below region A1 of the back metal plate 16, which is four, is less than the number of the through holes 17 in the comparison region A21, which is six. That is, the quantity of the through holes 17 in the directly-below region A1 is less than the quantity of the through holes 17 formed in a range of the region that has the same dimensions as and corresponds to the directly-below region A1, outside the directly-below region A1. Since the sizes of the through holes 17 are the same, the total volume of the through holes 17 in the directly-below region A1 is less than the total volume of the through holes 17 formed in the range of the comparison region A21. Therefore, the heat transfer area of the back metal plate 16 in the directly-below region A1 is increased. That is, the thermal conductivity of the semiconductor module 10 to the heat sink 13 when the semiconductor device 12 is heated is improved.

According to the present embodiment, the directly-below region A1 is divided into a formation region A3, which is a region of the back metal plate 16 where formation of through holes 17 is permitted, and a non-formation region A4, which is a region of the back metal plate 16 where formation of through holes 17 is not permitted. That is, the formation region A3 is a peripheral portion of the directly-below region A1. The non-formation region A4 is located inside the formation region A3.

Hereinafter, the formation region A3 and the non-formation region A4 will be described.

As shown in FIG. 2, in a plan view of the rectangular semiconductor device 12, one of the four sides of the mounting surface of the semiconductor device 12 and the opposite side are defined as first sides 12b. Two sides that are perpendicular to the first sides 12b are defined as second sides 12c. In the present embodiment, the formation region A3, where formation of through holes 17 is allowed, occupies 25% to 35%, preferably 30% of the dimension of the first sides 12b at either end of the first sides 12b. Also, the formation region A3 occupies 25% to 30%, preferably 30% of the dimension Y of the second sides 12c at either end of the second sides 12c. In other words, the formation region A3 occupies 25% to 35%, preferably 30% of the dimension Y of the second sides 12c from one of the first sides 12b toward the other first side 12b of the semiconductor device 12. The formation region A3 also occupies 25% to 35%, preferably 30% of the dimension X of the first sides 12b from one of the second sides 12c toward the other second side 12c. That is, the formation region A3 is a peripheral portion of the directly-below region A1, that is, an area that extends inward from the peripheral edge A11 and occupies a predetermined range.

The non-formation region A4, where formation of through holes 17 is not allowed, is a region inside the formation region A3 (inside the peripheral portion of the directly-below region A1). The non-formation region A4 is located directly below a center portion 12d of the semiconductor device 12. Accordingly, the non-formation region A4 is located in a center portion of the directly-below region A1. The through holes 17 located within the range of the directly-below region A1 are located in the formation region A3, that is, in a peripheral portion of the directly-below region A1. No through holes 17 are formed in the non-formation region A4. On the other hand, the through holes 17 located in the comparison region A21 are located in the center portion and the peripheral portion of the comparison region A21.

In the directly-below region A1, positions at which the through hole 17 are formed may be changed to any positions outside the non-formation region A4. The range of the inside region A2 is changed by changing the positions of the through holes 17 in the directly-below region A1. The through hole 17 are not formed in the non-formation region A4 even if the range of the inside region A2 is changed. The non-formation region A4 is thus contained in the range of the inside region A2.

The through holes 17 of the present embodiment are not formed in the non-formation region A4. Therefore, the through holes 17 are formed in the formation region A3. The positions at which the through holes 17 are formed in the directly-below region A1 are not necessarily limited to the range of the formation region A3, but may be formed outside the formation region A3. The through holes 17 may be formed in the vicinity of the peripheral edge A11 of the directly-below region A1.

The non-formation region A4 is formed at a position directly below the center portion 12d of the semiconductor device 12. Therefore, the center portion 12d of the semiconductor device 12 is joined to the heat sink 13 without through holes 17 in between.

Since the center portion 12d of the semiconductor device 12 is joined to the heat sink 13 without through holes 17 in between, diffusion of the heat transferred from the semiconductor device 12 to a part directly below the center portion 12d is unlikely to be hindered. When the semiconductor module 10 is operating, heat is concentrated most in the center portion 12d of the semiconductor device 12. The fact that diffusion of the heat transferred to a part directly below the center portion 12d of the semiconductor device 12 is not easily hindered means that the thermal conductivity of the semiconductor module 10 is improved.

Operation of the semiconductor module 10 will now be described.

The semiconductor module 10, which has the above described structure, is applied, for example, to a hybrid car, which has an electric motor as a part of the drive source. The semiconductor module 10 controls electricity supplied to the electric motor in accordance with the driving conditions of the vehicle. When the semiconductor module 10 operates, the semiconductor device 12 generates heat. The heat generated by the semiconductor device 12 is radially diffused from the joint surface of the semiconductor device 12 toward the circuit substrate 11. The heat generated by the semiconductor device 12 is transferred to the front metal plate 15, the ceramic substrate 14, the back metal plate 16, and the heat sink 13 in that order.

The heat generated by the semiconductor device 12 concentrates on the center portion 12d of the semiconductor device 12. Accordingly, the center portion 12d of the semiconductor device 12 is a heat concentration portion. That is, the heat generated by the semiconductor device 12 is transferred to the part directly below the center portion 12d by the greatest amount.

The center portion 12d of the semiconductor device 12 is joined to the heat sink 13 without through holes 17 in between. Therefore, diffusion of the heat transferred to the part directly below the center portion 12d of the semiconductor device 12 is transferred to the heat sink 13 without being hindered by the through holes 17.

On the other hand, of the heat generated by the semiconductor device 12, heat other than the heat that is directly transferred to the part directly below the center portion 12d reaches the heat sink 13 after bypassing the through holes 17. The heat transferred to parts other than the part directly below the center portion 12d of the semiconductor device 12 travels longer distance before reaching the heat sink 13 than the heat transferred to the part directly below the center portion 12d of the semiconductor device 12. Therefore, the heat transferred to parts other than the part directly below the center portion 12d of the semiconductor device 12 is cooled before reaching the heat sink 13 and is less likely to be the cause of the generation of thermal stress. Thus, in the present embodiment, compared to a case in which, for example, through holes 17 are also formed in the non-formation region A4, which is directly below the center portion 12d of the semiconductor device 12, the balance between the improvement of the heat radiating performance at the directly-below region A1, at which a great amount of heat is generated, and the absorption of the thermal stress.

The back metal plate 16 relaxes the thermal stress accompanying the heat generation by the semiconductor device 12. Therefore, cracks are prevented from forming in the joint portion between the ceramic substrate 14 and the back metal plate 16. Also, the heat sink 13 is prevented being warped.

The above embodiment has the following advantage.

(1) The through holes 17 formed in the back metal plate 16 relax thermal stress. Since the back metal plate 16 has the non-formation region A4, the heat transfer area in the directly-below region A1 is increased on the back metal plate 16. The thermal conductivity in the range of the directly-below region A1 of the back metal plate 16 is improved compared, for example, to the thermal conductivity of the comparison region A21. That is, the thermal conductivity of the directly-below region A1 is improved compared to the thermal conductivity of a region that corresponds to and has the same dimensions as the directly-below region A1 outside the directly-below region A1 on the back metal plate 16. Therefore, the heat generated by the semiconductor device 12 is readily transferred to the region directly below the semiconductor device 12, and the thermal diffusion is unlikely to be hindered. Therefore, the heat generated by the semiconductor device 12 is reliably transferred to the heat sink 13. A balance is achieved between the improvement of the heat radiating performance in the region directly below the semiconductor device 12, which generates a great amount of heat, and absorption of thermal stress.

(2) No through holes 17 are formed in the inside region A2 in the directly-below region A1 of the back metal plate 16. Therefore, the inside region A2 functions as a joint layer that joins the heat sink 13 to the ceramic substrate 14. The center portion 12d of the semiconductor device 12 is joined to the heat sink 13 without through holes 17 in between. Thus, diffusion of the heat that is transferred to the part directly below the center portion 12d of the semiconductor device 12 is less likely to be hindered. Since the diffusion of the heat that is transferred to the part directly below the center portion 12d of the semiconductor device 12 is unlikely to be hindered, the present embodiment allows the heat generated by the semiconductor device 12 to be efficiently radiated. That is, a balance is achieved between the improvement of the heat radiating performance in the region directly below the semiconductor device 12, which generates a great amount of heat, and absorption of thermal stress.

(3) Through holes 17 are formed in the formation region A3 in the directly-below region A1 of the semiconductor device 12. Thus, when the semiconductor device 12 is operating, the back metal plate 16 efficiently relaxes stress. Therefore, it is easy to prevent cracks from forming in the joint portion between the ceramic substrate 14 and the back metal plate 16 and to prevent the heat sink 13 from being warped.

Also, the stress relaxation spaces of the back metal plate 16 are formed by the through holes 17, which extend through the back metal plate 16 in the laminating direction of the ceramic substrate 14 and the back metal plate 16. The back metal plate 16 is therefore easily deformed. That is, the thermal stress generated when the semiconductor module 10 is operating is readily absorbed by the back metal plate 16.

(4) The back metal plate 16 functions not only as a joint layer that joins the ceramic substrate 14 and the heat sink 13 to each other, but also as a stress relaxation member. Thus, according to the present embodiment, the joint layer and the stress relaxation member do not need to be provided as separate members. This reduces the number of components.

(5) Compared to a case in which, for example, the back metal plate 16 and a stress relaxation member are provided as separate members, the present embodiment increases the volume of the stress relaxation member. That is, the stress relaxation performance is improved.

A second embodiment of the present disclosure will now be described with reference to FIGS. 3 to 5.

In the embodiments described below, like or the same reference numerals are given to those components that are like or the same as the corresponding components of the above embodiment, and detailed explanations are omitted or simplified.

Figure 3:
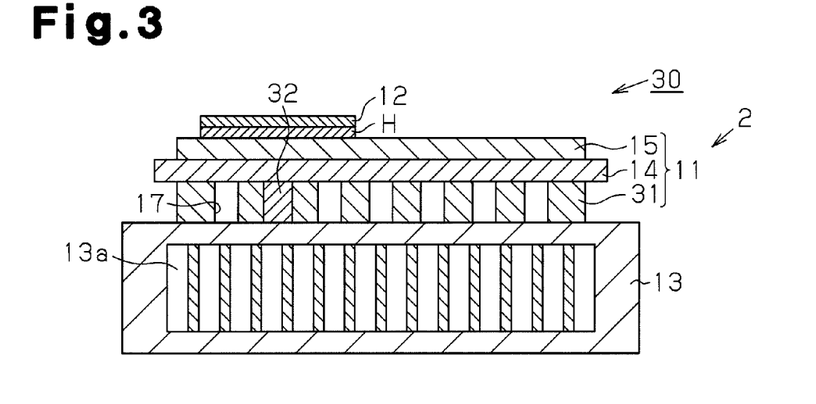
FIG. 3 is a vertical cross-sectional view illustrating a semiconductor module according to a second embodiment.
Figure 4:
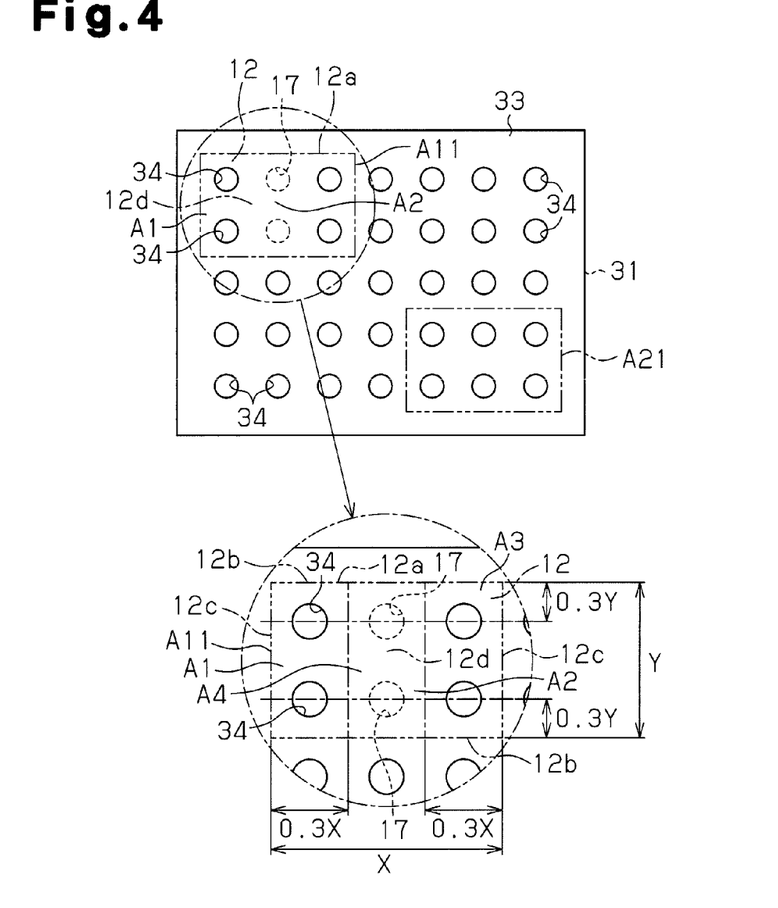
FIG. 4 is a plan view showing the relationship between the brazing filler and the back metal plate shown in FIG. 3.

As shown in FIG. 3, a semiconductor apparatus, which is a semiconductor module 30 in this embodiment, has a back metal plate 31 having a joint portion 32. The joint portion 32 is formed by filling through holes 17 formed, for example, in a non-formation region A4 with brazing filler. The joint portion 32 is located between an adjacent pair of a plurality of through holes 17 formed in the peripheral portion of the region A1 directly below the semiconductor device 12. The joint portion 32 is formed, for example, of brazing filler, which is pure aluminum or copper. The joint portion 32 is integrated with the back metal plate 31. Therefore, the joint portion 32 functions as a part of a joint layer that joins the ceramic substrate 14 to the heat sink 13.

That is, in the present embodiment, in the back metal plate 31, in which through holes 17 are formed at constant intervals, a greater amount of brazing filler fills the through holes 17 located in the range of the non-formation region A4 than compared to the through holes 17 located outside the range of the non-formation region A4. Accordingly, the heat transfer area in the non-formation region A4 is increased.

In the present embodiment, the circuit substrate 11 and the heat sink 13 form a heat radiator 2. The circuit substrate 11 includes a ceramic substrate 14, a front metal plate 15, and a back metal plate 31. The heat radiator 2 and the semiconductor device 12 form a semiconductor module 30.

The amount of brazing filler filling the through holes 17 in the range of the directly-below region A1 of the back metal plate 31 is greater than the amount of brazing filler that flows into the through holes 17 in the comparison region A21. That is, the amount of brazing filler filling the through holes 17 in the directly-below region A1 is greater than the amount of brazing filler filling the through holes 17 formed in a range of the region that has the same dimensions as an corresponds to the directly-below region A1 outside the directly-below region A1.

Next, a brazing process, which is one step in the manufacturing method of the heat radiator 2 of the present embodiment, will be described. That is, a method for brazing the ceramic substrate 14, the back metal plate 31, and the heat sink 13 will be described. In the present embodiment, the back metal plate 31, in which through holes 17 are formed at constant intervals, is used. That is, through holes 17 are formed also in the range of the non-formation region A4 of the back metal plate 31 used in the present embodiment.

Figure 5:
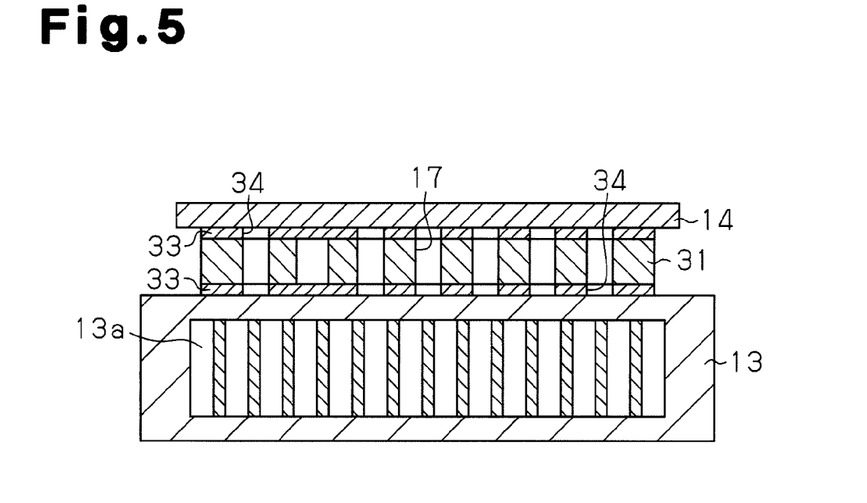
FIG. 5 is an explanatory diagram of procedure for manufacturing the semiconductor module shown in FIG. 3.

As shown in FIG. 5, two plates of brazing fillers 33 are prepared. Like the through holes 17 formed in the back metal plate 16 of the first embodiment, holes 34, which function as spaces, are formed in the plates of the brazing filler 33. Specifically, in the plates of brazing filler 33, a plurality of holes 34 are formed to correspond to the through holes 17 formed in the back metal plate 31, outside the directly-below region A1. On the other hand, in the range of the directly-below region A1 of the plates of the brazing filler 33, holes 34 are formed to correspond to the through holes formed in the vicinity of the outer edge A11 of the directly-below region A1. No holes 34 are formed in the inside region A2 of the plates of the brazing filler 33. That is, no holes 34 are formed in the inside region A2, which is inside the holes 34 formed in the directly-below region A1 in the plates of brazing filler 33. Therefore, outside the directly-below region A1, holes 34 are formed to correspond to the through holes 17. In the brazing filler 33, the total volume of the holes 34 in the range of the directly-below region A1 is less than the total volume of the holes 34 formed in the comparison region A21. The comparison region A21 is located outside the directly-below region A1 and has the same dimensions as the directly-below region A1 to correspond to the directly-below region A1. In other words, the amount of brazing filler of the directly-below region A1 is greater than the amount of the brazing filler 33 of the comparison region A21. That is, the amount of the brazing filler 33 of the directly-below region A1 is greater than the amount of the brazing filler 33 of the comparison region A21, which is located outside the directly-below region A1 and has the same dimensions as the directly-below region A1 so as to correspond to the directly-below region A1.

As shown in FIG. 5, a first plate of the brazing filler 33 is located between the ceramic substrate 14 and the back metal plate 31. The second plate of brazing filler is located between the back metal plate 31 and the heat sink 13. In this manner, the ceramic substrate 14, a plate of the brazing filler 33, the back metal plate 31, a plate of the brazing filler 33, and the heat sink 13 are laminated in that order. Therefore, the brazing filler 33 is located at the joint interface of the back metal plate 31. In the present embodiment, the joint interfaces of the back metal plate 31 include both of the front surface and the back surface of the back metal plate 31. In the back metal plate 31, outside the range of the non-formation region A4, the plates of the brazing filler 33 are positioned such that the through holes 17 match with the holes 34 of the plates of the brazing filler 33. As shown in FIG. 4, in the non-formation region A4, the brazing filler 33 is arranged such that the through holes 17 do not match with the holes 34 of the brazing filler 33. Therefore, in the range of the directly-below region A1, all the openings of the through holes 17 formed in the non-formation region A4 are covered with the brazing filler 33. On the other hand, outside the directly-below region A1, the openings of the through holes 17 are not covered with the brazing filler 33.

As described above, with the two plates of the brazing filler 33 arranged as shown in FIG. 5, the brazing filler 33 is heated by a heating apparatus such as a reflow furnace to a temperature above the melting temperature and melted. The melted brazing filler 33 flows in the through holes 17 in the non-formation region A4. On the other hand, the melted brazing filler 33 does not flow in the through holes 17 in ranges other than the non-formation region A4. Even if the melted brazing filler 33 flows in through holes 17 outside the non-formation region A4, the amount of brazing filler 33 is significantly small compared to the amount of the brazing filler 33 that flows in the through holes 17 in the non-formation region A4. Therefore, the amount of melted brazing filler filling the through holes 17 in the non-formation region A4 is greater than the amount of brazing filler filling the other through holes 17 in the directly-below region A1. The melted brazing filler 33 is cooled to a temperature below the melting temperature and set, so that the heat radiator 2 shown in FIG. 3 is produced. In the range of the directly-below region A1, the amount of brazing filler filling the through holes 17 in the non-formation region A4 is greater than the amount of brazing filler filling the through holes 17 in the formation region A3. After the heat radiator 2 is produced, the semiconductor device 12 is welded to the heat radiator 2 to produce the semiconductor module 30.

In addition to the advantages (1) to (5) of the first embodiment, the present embodiment provides the following advantages.

(6) Plates of the brazing filler 33 are formed such that, when the brazing filler 33 is melted during the manufacturing process, a great amount of brazing filler 33 flows in the through holes 17 in the non-formation region A4 of the back metal plate 31. Therefore, when the brazing filler 33 that has flowed in the through holes 17 is set, the volume of the through holes 17 in the directly-below region A1 is smaller than that of the through holes 17 in the comparison region A21. That is, according to the present embodiment, the heat transfer area in the directly-below region A1 can be increased while using the back metal plate 31, in which through holes 17 are formed at constant intervals. The thermal conductivity of the back metal plate 31 in the range of the directly-below region A1 is improved compared to the thermal conductivity of the comparison region A21, which is outside the range of the directly-below region A1. Therefore, according to the present embodiment, the heat generated by the semiconductor device 12 is reliably transferred to the heat sink 13. The present embodiment thus improves the balance between absorption of thermal stress and the improvement of the heat radiating performance in the directly-below region, which generates a great amount of heat.

(7) The brazing filler 33 used in the manufacturing process is formed such that, in the directly-below region A1, the amount of the brazing filler 33 filling the through holes 17 in the non-formation region A4 is greater than the amount of the brazing filler 33 filling the through holes 17 in the formation region A3. The brazing filler 33 is regulated when melted to flow into the through holes 17, or the stress relaxation space. Therefore, the volume of the through holes 17 in the directly-below region A1 is smaller than the volume of the through holes 17 in the comparison region A21.

(8) Before the brazing filler 33 is melted, the openings of the through holes 17 in the non-formation region A4 in the directly-below region A1 are all covered with the brazing filler 33. On the other hand, outside the directly-below region A1, the openings of the through holes 17 are not covered with the brazing filler 33. Therefore, the melted brazing filler 33 readily flows in the through holes 17 in the non-formation region A4.

The above illustrated embodiments may be modified as follows.

In the first and second embodiments, the through holes 17 may be arranged such that distance between each of the through holes 17 formed at positions close to the peripheral edge A11 of the directly-below region A1 and the adjacent one of the through holes 17 formed outside the directly-below region A1 varies.

In the first and second embodiments, the through holes 17 may be replaced by recesses that open in the direction of thickness of the back metal plates 16, 31. That is, the through holes 17 may be replaced by holes each of which has an open end either on the front surface or the back surface of the back metal plate 16, 31, and a closed end in the other. Even in this case, thermal stress when the semiconductor module 10 operates is relaxed.

Figure 6:
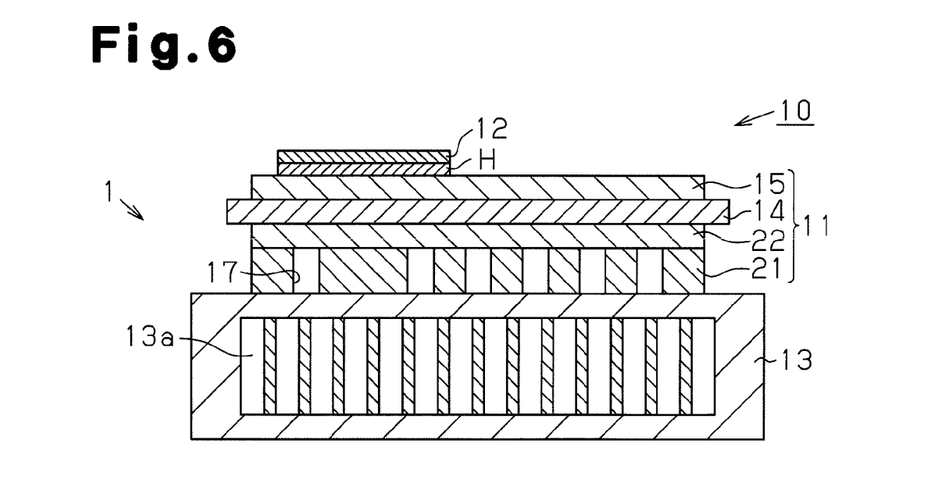
FIG. 6 is a vertical cross-sectional view illustrating a semiconductor module according to a modified embodiment.

As shown in FIG. 6, the back metal layer may be formed by laminating a first back metal plate 21 and a second back metal plate 22. For example, a first back metal layer, which is a first back metal plate 21, is laminated on the heat sink 13. A second back metal layer, which is a second back metal plate 22, is laminated on the first back metal plate 21. A ceramic substrate 14 is laminated on the second back metal plate 22. The back surface of the first back metal plate 21 is joined to the front surface of the heat sink 13. The second back metal plate 22 is located between and joined to both of the front surface of the first back metal plate 21 and the back surface of the ceramic substrate 14.

Through holes 17 serving as stress relaxation spaces are formed, for example, in the first back metal plate 21. No through holes 17 are formed in the second back metal plate 22. Since no through holes 17 are formed in the second back metal plate 22, the heat generated by the semiconductor device 12 is not hindered from being diffused, and effectively transferred to the first back metal plate 21. The heat is efficiently transferred to the heat sink 13.

In the first and second embodiments, a plurality of the semiconductor device 12 may be joined to the front metal plate 15, which is a wiring layer. In this case, through holes 17 are formed in a peripheral portion of the region A1 of the back metal plate 16, 31 directly below the semiconductor device 12, that is, in the formation region A3.

In the first and second embodiments, the shape of the through holes 17 may be circular as shown in FIG. 2 and also may be changed to elliptic or rectangular. That is, as long as the through holes 17 function as a stress relaxation space, the through holes 17 may take any shape.

In the first embodiment, the total volume of the stress relaxation spaces in the directly-below region A1 may be changed as long as it does not surpass the volume of the stress relaxation spaces in the comparison region A21. For example, the diameter of the through holes 17 in the range of the directly-below region A1 may be smaller than the diameter of the through holes 17 outside the range of the directly-below region A1. Alternatively, the stress relaxation spaces in the directly-below region A1 may be formed by recesses, and the stress relaxation spaces outside the directly-below region A1 may be formed by through holes.

The first and second embodiments, the number of the through holes 17 outside the non-formation region A4 may be reduced or increased.

In the first and second embodiments, the total volume of the stress relaxation spaces formed in the directly-below region A of the back metal plates 16, 31 may be zero. That is, no stress relaxation spaces may be formed in the directly-below region A1.

Figure 7A:
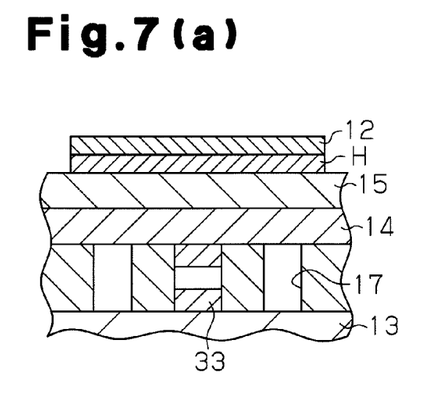
FIGS. 7(a) to 7(d) are enlarged partial cross-sectional views each showing a semiconductor module according to a modified embodiment.

In the second embodiment, the through holes 17 in the non-formation region A4 do not necessarily need to be completely filled with the brazing filler 33. For example, the structures shown in FIGS. 7(a) to 7(d) may be employed, in which the volume of the stress relaxation spaces in the non-formation region A4 is smaller than the volume of the stress relaxation spaces in the other regions. In FIG. 7(a), brazing filler 33 fills a part in a through hole 17 that is close to the ceramic substrate 14 and a part close to the heat sink 13. A center portion in the thickness direction of the through hole 17 is a void, which is not filled with brazing filler.

Figure 7B:
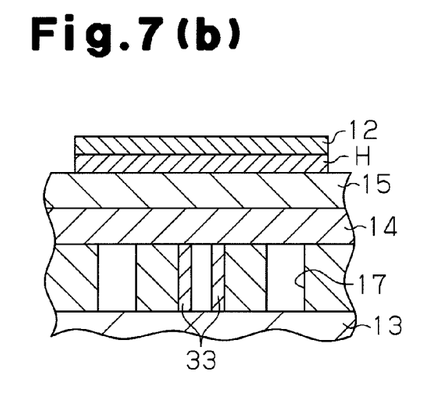

In FIG. 7(b), brazing filler 33 only fills a radially outer portion of a through hole 17. In other words, brazing filler exists on the circumferential wall of the through hole 17, but does not exists at the axis.

Figure 7C:
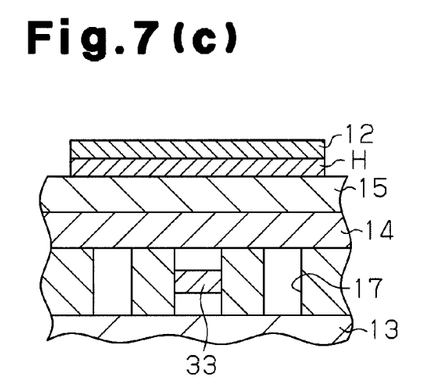

In FIG. 7(c), brazing filler 33 only fills a substantially center portion in the axial direction of a through hole 17. That is, a part in the through hole 17 that is close to the ceramic substrate 14 and a part close to the heat sink 13 are not filled with brazing filler.

Figure 7D:
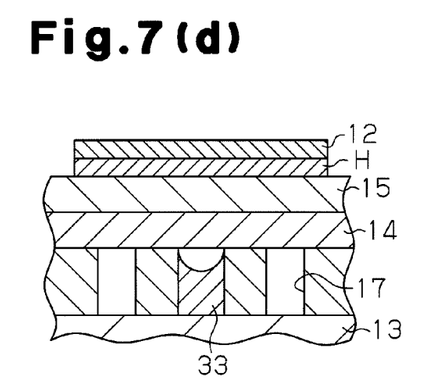

In FIG. 7(d), a through hole 17 is filled with brazing filler 33 such that a recess is formed in a part in the through hole 17 that is close to the ceramic substrate 14. A part closer to the heat sink 13 is closed.

In the second embodiment, one of the brazing filler 33 located between the back metal plate 31 and the ceramic substrate 14 and the brazing filler 33 located between the back metal plate 31 and the heat sink 13 may have a structure other than that of the second embodiment.

In the first embodiment, the ceramic substrate 14, the back metal plate 16, and the heat sink 13 may be joined to each other with brazing filler having spaces that correspond to the through holes 17 in the back metal plate 16 or with brazing filler having no spaces.

In the first and second embodiments, the semiconductor device 12 may joined to the circuit substrate 11 with brazing filler.

In the second embodiment, the ceramic substrate 14, the front metal plate 15, the back metal plate 31, the heat sink 13, and the semiconductor device 12 may be brazed simultaneously.

In the second embodiment, it is sufficient to cover with brazing filler 33 the opening of at least one of the through holes 17 in the range of the non-formation region A4.

In the second embodiment, it is sufficient to cover only a part of the opening of each through hole 17 with the brazing filler 33.

In the second embodiment, it is sufficient to fill only a part of each through hole 17 in the directly-below region A1. As long as this condition is met, the number of through holes 17 that are filled with brazing filler may be changed.

What is claimed is:

1. A heat radiator comprising:
a circuit substrate; and
a heat sink, wherein the circuit substrate includes:
an insulation substrate having a front surface and a back surface;
a front metal layer joined to the front surface of the insulation substrate, the front metal layer having a front surface to which a semiconductor device is joinable and a back surface joined to the insulation substrate; and
a back metal layer joined to the back surface of the insulation substrate, the back metal layer having a front surface joined to the insulation substrate and a back surface joined to the heat sink, and the back metal layer having a plurality of stress relaxation spaces, each stress relaxation space being configured to open at least at one of the front surface and the back surface of the back metal layer, wherein
a region in the back metal layer that is directly below the semiconductor device is defined as a directly-below region, and a region outside the directly-below region that corresponds to and has the same dimensions as the directly-below region is defined as a comparison region,
the plurality of stress relaxation spaces are provided in both the directly-below region and in the comparison region, and
the volume of the stress relaxation spaces in the directly-below region is less than a volume of the stress relaxation spaces provided in the comparison region.

2. The heat radiator according to claim 1, wherein
the stress relaxation spaces in the directly-below region are provided in a peripheral portion of the directly-below region and are not provided in a center portion of the directly-below region, and
the stress relaxation spaces in the comparison region are provided in a peripheral portion and a center portion of the comparison region so that the volume of the stress relaxation spaces in the directly-below region is less than the volume of the stress relaxation spaces provided in the comparison region.

3. The heat radiator according to claim 2, wherein
the insulation substrate, the back metal layer, and the heat sink are joined together with brazing filler, and
at least a part of the stress relaxation spaces in the directly-below region is filled with the brazing filler so that the volume of the stress relaxation spaces in the range of the directly-below region is less than the volume of the stress relaxation spaces formed in the range of the comparison region.

4. The heat radiator according to claim 1, wherein the back metal layer is a stress relaxation member.

5. The heat radiator according to claim 1, wherein the back metal layer includes:
a first back metal layer joined to the heat sink; and
a second back metal layer that is located between the first back metal layer and the insulation substrate and joined to the first back metal layer and the insulation substrate, wherein
the stress relaxation spaces are provided in the first back metal layer.

6. A method for manufacturing a heat radiator having a circuit substrate and a heat sink, the circuit substrate including:
an insulation substrate having a front surface and a back surface;
a front metal layer joined to the front surface of the insulation substrate, and the front metal layer having a front surface to which a semiconductor device is joinable and a back surface joined to the insulation substrate; and
a back metal layer joined to the back surface of the insulation substrate, the back metal layer having a front surface joined to the insulation substrate and a back surface joined to the heat sink, and the back metal layer having a plurality of stress relaxation spaces, wherein a region in the back metal layer that is directly below the semiconductor device is defined as a directly-below region, and a region outside the directly-below region that corresponds to and has the same dimensions as the directly-below region is defined as a comparison region,
the manufacturing method comprising:
preparing brazing filler, wherein there is more brazing filler in the directly below region than in the comparison region;
arranging the brazing filler at a joint interface of the back metal layer;
heating the brazing filler to a temperature above a melting temperature to melt the brazing filler; and cooling the melted brazing filler to a temperature below the melting temperature to set the brazing filler.

7. The manufacturing method according to claim 6, wherein preparing the brazing filler includes forming the brazing filler such that the brazing filler covers at least a part of an opening of at least one of the stress relaxation spaces in the directly-below region, and does not cover openings of the stress relaxation spaces in the comparison region.

8. A semiconductor apparatus comprising:
 a semiconductor device;
 a circuit substrate; and
 a heat sink, wherein the circuit substrate includes:
  an insulation substrate having a front surface and a back surface;
  a front metal layer joined to the front surface of the insulation substrate, and the front metal layer having a front surface to which the semiconductor device is joined and a back surface joined to the insulation substrate; and
  a back metal layer joined to the back surface of the insulation substrate, the back metal layer having a front surface joined to the insulation substrate and a back surface joined to the heat sink, wherein
  a region in the back metal layer that is directly below the semiconductor device is defined as a directly-below region, and a region outside the directly-below region that corresponds to and has the same dimensions as the directly-below region is defined as a comparison region, and stress relaxation spaces are provided in a peripheral portion of the directly-below region of the back metal layer, and outside the directly-below region and on the back metal layer, other stress relaxation spaces are provided in a range from an outer peripheral edge of the directly-below region to a peripheral edge of the back metal layer.

9. The semiconductor apparatus according to claim 8, wherein the stress relaxation spaces are through holes, which extend through the back metal layer in a laminating direction of the insulation substrate and the back metal layer.

* * * * *